United States Patent
Capasso et al.

(10) Patent No.: US 6,690,699 B2
(45) Date of Patent: Feb. 10, 2004

(54) QUANTUM CASCADE LASER WITH RELAXATION-STABILIZED INJECTION

(76) Inventors: Federico Capasso, 42 Westbrook Rd., Westfield, NJ (US) 07090; Alfred Yi Cho, 11 Kenneth Ct., Summit, NJ (US) 07901; Albert Lee Hutchinson, 2409 Cindy Dr., Columbus, GA (US) 31903; Gaetano Scamarcio, Via Generale C. A. Dalla Chiesa 24/B, 70124 Bari (IT); Deborah Lee Sivco, 16 Plainfield Ave., Warren, NJ (US) 07059; Mariano Troccoli, 380 Main St., Apartment 36, Chatham, NJ (US) 07928

(*) Notice: Subject to any disclaimer, the term of this patent is extended or adjusted under 35 U.S.C. 154(b) by 0 days.

(21) Appl. No.: 10/081,313

(22) Filed: Feb. 21, 2002

(65) Prior Publication Data

US 2002/0136252 A1 Sep. 26, 2002

Related U.S. Application Data

(60) Provisional application No. 60/273,179, filed on Mar. 2, 2001.

(51) Int. Cl.[7] .................................................. H01S 5/00
(52) U.S. Cl. .................................................. 372/44; 372/45
(58) Field of Search ................................... 372/44, 45, 96

(56) References Cited

U.S. PATENT DOCUMENTS

| | | | | |
|---|---|---|---|---|
| 5,457,709 A | * | 10/1995 | Capasso et al. | 372/45 |
| 5,727,010 A | * | 3/1998 | Capasso et al. | 372/45 |
| 5,901,168 A | * | 5/1999 | Baillargeon et al. | 372/96 |
| 5,963,571 A | * | 10/1999 | Wingreen | 372/45 |
| 5,978,397 A | * | 11/1999 | Capasso et al. | 372/45 |
| 6,091,753 A | * | 7/2000 | Capasso et al. | 372/45 |
| 6,137,817 A | * | 10/2000 | Baillargeon et al. | 372/45 |
| 6,154,475 A | * | 11/2000 | Soref et al. | 372/45 |
| 6,400,744 B1 | * | 6/2002 | Capasso et al. | 372/96 |
| 6,501,783 B1 | * | 12/2002 | Capasso et al. | 372/96 |

OTHER PUBLICATIONS

European Patent Office Search Report, Application No. 02251369.1–1231–, The Hague, Jun. 26, 2002.

Scamarcio, G. et al., *High peak power (2.2W) superlattice quantum cascade laser*, Electronic Letters, vol. 37, No. 5, Mar. 1, 2001, pp. 295–296.

Troccoli, M. et al., *Electronic distribution in superlattice quantum cascade lasers*, Appl. Phys. Lett., vol. 77, No. 8, Aug. 21, 2000, pp. 1088–1090.

Scarmarcio, G. et. al: "*High peak power (2.2W) superlattice quantum cascade laser*" Electronic Letters, vol. 37, Mar., 2001, pp. 295, 296.

Scamarcio, G. et. al: "*High–Power Infrared (8–Micrometer Wavelength) Superlattice Lasers*" Science, vol. 276, May, 1997, pp. 773–776.

Capasso, F. et. al: "*High–Performance Superlattice Quantum Cascade Lasers*" IEEE Journal of Selected Topics in Quantum Electronics, vol. 5, May/Jun., 1999, pp. 792–807.

Tredicucci, A. et. al: "*High–power inter–miniband lasing in intrinsic superlattices*" Applied Physics Letters, vol. 72, May, 1998, pp. 2388–2390.

(List continued on next page.)

*Primary Examiner*—Paul Ip
*Assistant Examiner*—Tuan Nguyen
(74) *Attorney, Agent, or Firm*—John F. McCabe

(57) ABSTRACT

An optical gain medium has first and second active layers and an injector layer interposed between the first and second active layers. The active layers have upper minibands and lower minibands. The injector layer has a miniband that transports charge carriers from the lower miniband of the first active layer to an excited state in the upper miniband of the second active layer in response to application of a voltage across the optical gain medium.

15 Claims, 4 Drawing Sheets

OTHER PUBLICATIONS

Tredicucci, A. et al: "*High–Performance Quantum Cascade Lasers with Electric–Field–Free Undoped Superlattice*" IEEE Photonics Technology Letters, vol. 12, Mar., 2000, pp. 260–262.

Tredicucci, A. et al., "*High performance interminiband quantum cascade lasers with graded superlattices*" Applied Physics Letters, vol. 73, Oct., 1998, pp. 2101–2103.

Schrenk, W. et. al: "*Continuous–wave operation of distributed feedback AlAs/GaAs superlattice quantum–cascade lasers*" Applied Physics Letters, vol. 77, Nov., 2000, pp. 3328–3330.

Troccoli, M. et. al: "*Electronic distribution in superlattice quantum cascade lasers*" Applied Physics Letters, vol. 77, Aug., 2000, pp. 1088–1090.

Capasso, F. et. al: "*New Frontiers in Quantum Cascade Lasers and Applications*" IEEE Journal of Selected Topics in Quantum Electronics, vol. 6, Novemner/Dec., 2000, pp. 931–947.

* cited by examiner

QUANTUM CASCADE LASER WITH RELAXATION-STABILIZED INJECTION

This application claims the benefit of U.S. provisional patent application No. 60/273,179, filed Mar. 2, 2001.

The U.S. Government has a paid-up license in this invention and the right in limited circumstances to require the patent owner to license to others on reasonable terms as provided for by the terms of contract No. DAAD19-00-C-0096 awarded by DARPA and the U.S. Army Research Office.

BACKGROUND OF THE INVENTION

1. Field of the Invention

This invention relates to superlattice quantum cascade lasers.

2. Description of the Related Art

FIG. 1 illustrates the miniband structure of a conventional optical gain medium 10. The optical gain medium 10 includes active layers 12, 12' and injector layer 14, which is interposed between the active layers 12, 12'. The active and injector layers 12, 12', 14 have miniband structures in their conduction bands. The miniband structures include upper and lower minibands 16, 18, in the active layers 12, 12', and transport miniband 20, in the injector layer 14. The miniband structures are produced by semiconductor superlattice structures in the active and injector layers 12, 12', 14.

The structure of the upper and lower minibands 16, 18 of the active layers 12, 12' fix the wavelength of the light emitted by gain medium 10. In particular, in quantum cascade (QC) lasers, charge carrier transitions from the upper to lower minibands 16, 18 produce the light emissions. Thus, stimulated optical emissions have wavelengths that corresponding to the energy of the miniband gap 22 separating the upper and lower minibands 16, 18.

Transport miniband 20 of injector layer 14 transports de-excited charge carriers from lower miniband 18 of active layer 12 to upper miniband 16 of adjacent active layer 12'. The transport miniband 20 replenishes inverted populations of charge carrier in the upper miniband 16 of the active layer 12'. Thus, the upper miniband 16 is the target upper miniband of the associated transport miniband 20. Keeping the inverted population of charge carriers replenished enables further optical emissions from the active layer 12'.

SUMMARY

Various embodiments of optical gain medium have injector and active layers in which associated transport and target upper minibands have mismatched lower edges during pumping. The mismatches enable relaxation processes to reduce densities in the active layers of charge carriers that have energies of the associated transport minibands. Reducing densities of such charge carriers in the active layers reduces backward transport of charge carriers through the injector layers. Reducing backward transport increases obtainable inverted populations of charge carriers over those obtainable in optical gain media that are similar except that such mismatches between associated transport and target upper minibands do not exist.

In one aspect, the invention features an optical gain medium having first and second active layers and an injector layer interposed between the first and second active layers. The active layers have upper minibands and lower minibands. The injector layer has a miniband that transports charge carriers from the lower miniband of the first active layer to an excited state in the upper miniband of the second active layer in response to application of a voltage across the optical gain medium.

In another aspect, the invention features a process for operating an optical gain medium with a plurality of active layers. The process includes transporting charge carriers from a lower miniband of one of the active layers to an upper miniband of an adjacent one of the active layers and relaxing the transported charge carriers to lower energy states in the same upper miniband.

In another aspect, the invention features an apparatus that includes an optical gain medium and electrical contacts adjacent opposite sides of the medium. The optical gain medium has a series of stages. Each stage includes an injector layer and an adjacent active layer. The active layers have upper and lower minibands that are separated by a miniband gap $E_{mg}$. The lower minibands have a width $\Delta_{lm}$. The electrical contacts are able to apply a voltage $V_{ps}$ across each one of the stages. $E_{mg}$ is smaller than $qV_{ps}-\Delta_{lm}$ with q being a charge of carriers in the minibands.

DETAILED DESCRIPTION OF THE EMBODIMENTS

Injector layers fix the maximal output optical powers of QC lasers, because the injector layers replenish inverted populations of active regions. Thus, the total transport rate by transport minibands of the injector layers defines the available output optical power of such lasers.

Figure 1:
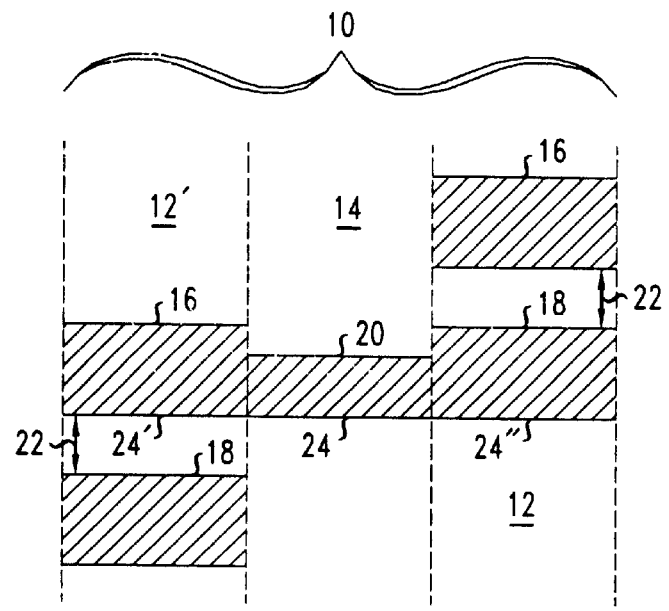
FIG. 1 shows the miniband structure of a conventional optical gain medium when electrically pumped to generate stimulated optical emission.

Referring to FIG. 1, in conventional gain medium 10, transport miniband 20, target upper miniband 16, and source lower miniband 18 have aligned lower miniband edges 24, 24', 24". This alignment of lower miniband edges 24, 24', 24" enables the transport miniband 20 to perform both forward and backward transport of charge carriers. The backward transport causes charge carriers to move out of the target upper miniband 16 of active layer 12'. The backward transport reduces the density of charge carriers available to form the inverted population of the target upper miniband 16. For this reason, the miniband alignment of gain medium 10 enables lower output optical powers than would otherwise be available in the absence of backward transport of charge carriers.

The amount of backward transport of charge carriers has a direct relation to the density in target active layer 12' of charge carriers with energies of transport miniband 20. Reducing the density of charge carriers with such energies in the target active layer 12' would reduce backward transport by injector layer 14. Unfortunately, the alignment of lower edges 24 and 24' fixes the density of charge carriers at energies of the transport miniband 20 to be equal to the density of charge carriers in the inverted population of the target upper miniband 16, which is a high density in ideal operating situations. Thus, the miniband alignment in the conventional gain medium 10 favors significant backward transport of charge carriers in ideal operating situations, i.e., high density inverted populations. For this reason, the miniband alignment in the conventional gain medium 10 produces a non-optimal operating situation where significant backward transport lowers the maximum output optical power.

Various embodiments of QC lasers have optical gain medium in which the lower edge of a transport miniband is higher than the lower edge of the associated target upper miniband. This mismatch of lower edges enables relaxation processes to lower densities of charge carriers in the associated target upper miniband at energies of the transport miniband. The lower densities reduce backward transport so that inverted populations of charge carriers can be maintained at higher levels than in gain medium where miniband alignments do not defavorize backward transport of the charge carriers.

Figure 2:
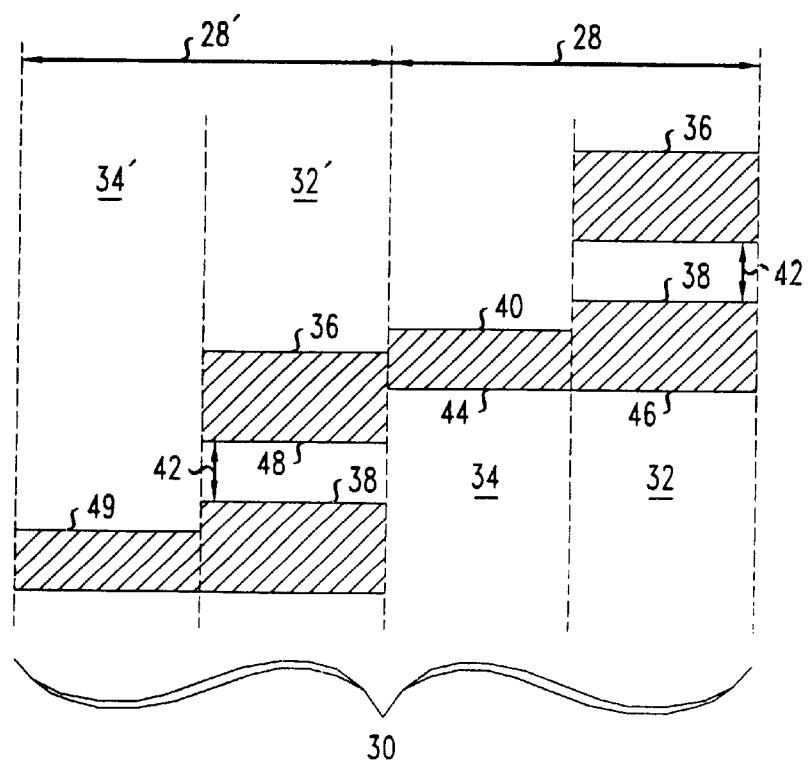
FIG. 2 shows the miniband structure of an improved optical gain medium when electrically pumped to generate stimulated optical emission.

FIG. 2 shows several layers of one embodiment of an optical gain medium 30. The gain medium 30 includes a sequence of stages 28, 28' of which two are shown. Each stage 28, 28' includes an injector layer 34, 34' and an associated source active layer 32, 32'. The injector layer 34 transports charge carriers to the active layer 32' of the next stage in response to electrical pumping.

The active layers 32, 32' and injector layers 34, 34' have superlattice structures that produce different miniband structures therein. The active layers 32, 32' have upper minibands 36 and lower minibands 38. By making electronic transitions from the upper minibands 36 to lower minibands 38 of the same active layer 32, 32', charge carriers generate light for stimulated emission or lasing. During stimulated emission, the emitted light has a wavelength that corresponds to the energy $E_{mg}$ of the miniband gap 42.

The injector layers 34 have transport minibands 40, 40' that transport deexcited charge carriers, i.e., electrons or holes, from a source lower miniband 38 to a target upper miniband 36. The forward transport of charge carriers goes from one stage 28 to the next stage 28'.

FIG. 2 shows the miniband structure of gain medium 30 during optimal electrical pumping for stimulated emission. During pumping, the lower edge of transport miniband 40 is positioned to enable forward transport of charge carriers from a source lower miniband 38 of active layer 32 to target upper miniband 36 of adjacent active layer 32'. Pumping facilitates forward transport out of the active layer 32 by aligning the lower edges 44, 46 of the transport miniband 40 and source lower miniband 38 of the same stage 28. Herein, such an alignment of a transport miniband and an associated source lower miniband is referred to as a flat-band condition. For the same pumping conditions, backwards transport from the target upper miniband 36 to the source lower miniband 38 is also defavorised, because the lower edge 44 of the transport miniband 40 is positioned above the lower edge 48 of the target upper miniband 36.

The mismatch between lower edges 44, 48 of the transport and target upper minibands 40, 36 enables intra miniband electronic relaxation processes to de-excite charge carriers transported to the target upper miniband 36. De-exciting the transported charge carriers lowers the density in the target upper miniband 36 of charge carrier with energies of the transport miniband 40. In turn, this de-excitation reduces the probability that the transported charge carriers will propagate backward to source lower miniband 36'. Reducing such backward propagation increases the inverted population in active layer 32' over the population that would exist in a gain medium that was similar except that lower edges of target upper miniband and associated transport miniband matched.

The lower edges 44, 48 of transport miniband 40 and associated target upper miniband 36 have a mismatch that is, at least, one to several times the average thermal energy for charge carriers in target upper miniband 36 at the operating temperature. Preferably, the lower edge 44 is 5 or more times the average thermal energy above the lower edge 48 and more preferably 10 or more times the average thermal energy above the lower edge 48. Since these miniband mismatches are, in each case, greater than the relevant average thermal energy, de-excited charge carriers in the upper miniband 36 are rarely thermally re-excited up to energies of transport miniband 40. For this reason, intraband electronic relaxation effectively removes the transported charge carriers from the states of the target upper miniband 36 with strong probabilities of causing backward propagation via the transport miniband 40.

Since efficient forward transport requires overlap between transport and target upper minibands 40, 36 and low backward transport requires a mismatch between the transport and target upper minibands 40, 36, the upper miniband 36 has a minimum width, $\Delta_{um}$. The width, $\Delta_{um}$, should, at least, be larger than the average thermal energy of charge carriers in the upper miniband 36, e.g., at 300° K, is preferably 3–5 or more times this average thermal energy and more preferably is 10 or more times this average thermal energy. For such a width, a miniband mismatch can reduce backward transport of charge carriers without interfering with forward transport of the charge carriers.

Figure 3:
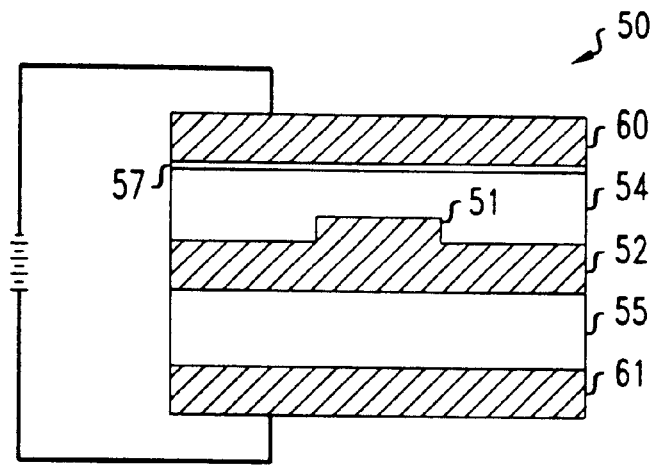
FIG. 3 shows an embodiment of a quantum cascade (QC) laser that is based on a gain medium of the type shown in FIG. 2.

FIG. 3 is a cross sectional view through a Fabret-Perot cavity of a quantum cascade (QC) laser 50 with the gain medium 30 of FIG. 2. The Fabret-Perot cavity is an optical waveguide 51 that is constructed from an optical core layer 52 and optical cladding layers 54, 55. The exemplary optical waveguide 51 is formed by a ridge whose width, w, is about 38 μm, and whose length of about 2.25 mm long. Other embodiments use optical waveguides that are completely surrounded by optical cladding (not shown). The optical cladding layers 54, 55 have a lower refractive index than the waveguide core layer 52 so that light is strongly index-confined to optical waveguide 51. The optical core and cladding layers 52, 54, 55 are made by well-known wet etching.

The core layer 56 is optical gain medium 30, shown in FIG. 2. The gain medium is electrically pumped by a current passing between metallic contacts 60, 61. During pumping, some embodiments maintain QC laser 50 at a low temperature to improve performance. To maintain the low temperature, the QC laser 50 is indium-soldered onto a copper holder, which is then mounted in a He-flow cryostat (both not shown).

Referring to FIGS. 2 and 3, the miniband structure of gain medium 30 and optical core layer 52 results from semiconductor superlattice structures in the active and injector layers 32, 32', 32, 34'. The optical core layer 52 includes a sequence of stages, i.e., paired active and injector layers, e.g., layers 32, 34 and layers 32', 34'. The active layers 32, 32' are intrinsic semiconductor superlattice structures. The injector layers 34, 34' are doped semiconductor superlattice structures that screen external electric fields and produce a selected voltage drop per stage when the gain medium is electrically pumped. The per stage voltage drop, i.e., over a pair of active and injector layers, is $(\Delta_{lm}+E_{mg}+\delta)/q$. Here, $\Delta_{lm}$, $E_{mg}$, $\delta$, and q are the width of the active layer's lower miniband 38, the active layer's miniband gap 42, the mismatch between lower edges 48, 44 of the transport miniband 40 and the target upper miniband 36, and the charge of the current carriers, respectively. This per stage voltage drop produces a miniband alignment that is the same for different stages and large current transport through injector layers 40, 49 when the gain medium 30 is electrically pumped. The transport miniband 40 provides transport so that the charge carriers, e.g., electrons or holes, accumulate at the lower edge of upper miniband 36 after relaxation-induced de-excitation.

Some such lasers generate peak powers of about 2.2 watts per facet at wavelengths of about 8.4 $\mu$m and temperatures of about 80° K.

Performance can be further improved by chirping superlattice active regions or intrinsic superlattices where overlaps between states of laser transition are high so that phonon bottleneck effects are low.

An exemplary embodiment of QC laser 50 uses Gallium (Ga) Indium (In) Arsenide (As)/Aluminum (Al) Indium Arsenide-type superlattice structures for active layers 32, 32' and injector layers 34, 34'. The superlattices are formed by alternating layers of $Ga_{0.47}In_{0.53}As$ and layers of $Al_{0.48}In_{0.52}As$. In the active layers 32, 32', the alternating layers of the superlattice have the following sequence of thicknesses: 2/3.7/1/4.1/1/4.6/1/4.6/1/4.6/1/4.6/1/4.5/1/4.3. In the injector layers 34, 34', the alternating layers of the superlattice have the following sequence of thicknesses: 4.0/9/3.9/9/3.9/1.1/3.7/1.5/3.3/1.9/2.9/2.1/2.7/2.6/2.2/3.0/1.8/3.3. In each sequence, numbers provide layer thicknesses in nanometers, and AlInAs layers and GaInAs layers are bolded and unbolded, respectively. In the active layers 32, 32', the superlattices are undoped. In the superlattices of the injector layers 34, 34', some GaInAs and AlInAs layers are n-type doped to a dopant density of about $1\times10^{18}$ per centimeter (cm) cubed. Underlining indicates the n-type-doped superlattice layers in the above sequence.

In the exemplary embodiment of QCL laser 50, optical core layer 52 includes twenty-five stages 28, 28' of paired active and injector layers 32, 34 and outer $Ga_{0.47}In_{0.53}As$ layers. The twenty-five active stages 28, 38' are sandwiched between the pair of outer GaInAs layers. The outer GaInAs layers having n-type dopant densities of about $5\times10^{16}$ $cm^{-3}$. The outer GaInAs layer closest to the InP substrate is about 400 nm thick, and the outer GaInAs layer farthest from the InP substrate is about 220 nm thick. The various layers of the optical core layer are grown over the InP substrate by molecular beam epitaxy processes known to those of skill in the art.

The two optical cladding layers 54, 55 have lower refractive indexes than the active optical core layer 52. The lower cladding layer 55 is the InP substrate itself. The upper cladding layer 55 includes two $Al_{0.48}In_{0.52}As$ layers. Each of these AlInAs layers is about 1.2 $\mu$m thick each. The two AlInAs layers of the upper cladding layer have n-dopant densities of about $1\times10^{17}$ $cm^{-3}$ and about $2\times10^{17}$ $cm^{-3}$, respectfully.

Some embodiments of the QC laser also include a top layer 57 of $Ga_{0.47}In_{0.53}As$. This top layer 57 is about 500 nm thick and has an n-type dopant density of about $7\times10^{18}$ $cm^{-3}$. The top layer 57 provides plasmon-enhanced optical confinement for light that is propagating in the optical waveguide.

The layer sequence of the exemplary embodiment of QC laser 50 produces the flat-band condition between pairs of source lower minibands 38 and transport minibands 40 for applied per stage voltages of about 0.330 V. The 0.330 applied per stage voltage is about 35 milli-volts above the onset voltage for strong current injection, i.e., the current threshold for lasing. For the 0.330 applied per stage voltage, the transport miniband 40 also injects transported charge carriers into high-energy states of target upper miniband 36. The transported charge carriers are injected into states that are, at least, 3–5 average thermal energies above lower edge 48 of the target upper miniband 36 for this pumping current.

Figure 4:
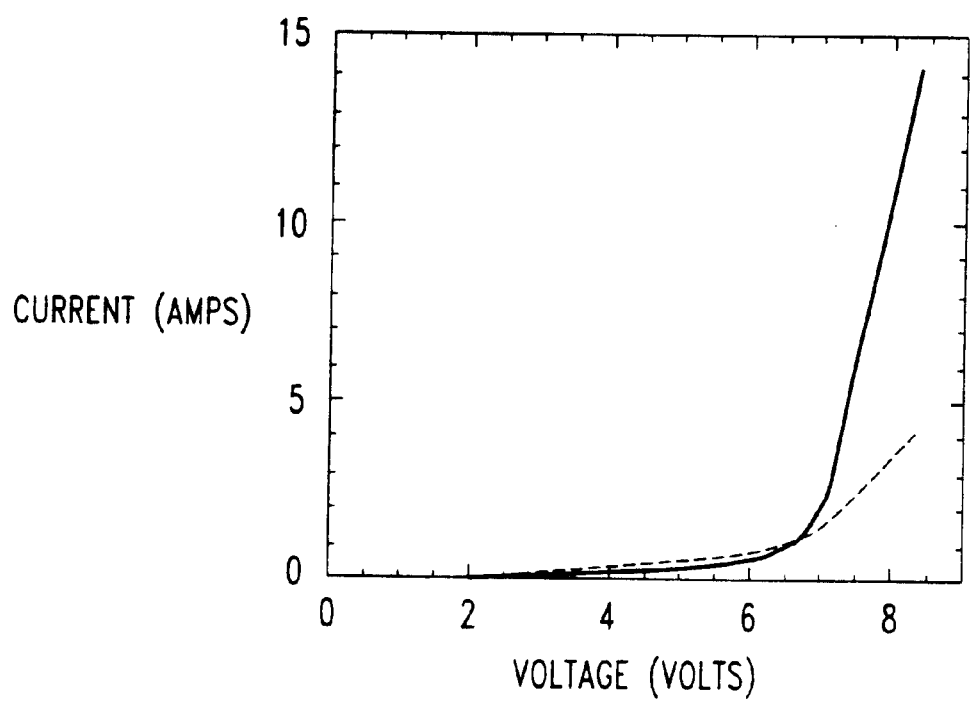
FIG. 4 shows contrasting electrical characteristics of QC lasers that do and that do not inject charge carriers into excited states of target upper minibands of active layers.

FIG. 4 compares electrical performance of the exemplary embodiment of QC laser 50 (solid line) with a second QC laser based on a GaInAs/AlInAs superlattice structure. The exemplary and second QC lasers have identical active layers and different injector layers. The injector layers of the second QC laser do not produce a mismatch between transport minibands and target upper minibands of active layers when pumped. While both the exemplary and second QC lasers have onset voltages for lasing of about 7 volts, the two QC lasers behave differently when pumped with currents that are higher than the onset voltage. Above the onset voltage, the exemplary embodiment of QC laser 50 has a significantly lower resistance than the second QC laser, i.e., a higher current for the same pumping voltage. The lower resistance for above-onset pumping voltages results, in part, from the mismatch between transport and target upper minibands 40, 36 that pumping produces in the QC laser 50.

Figure 5:
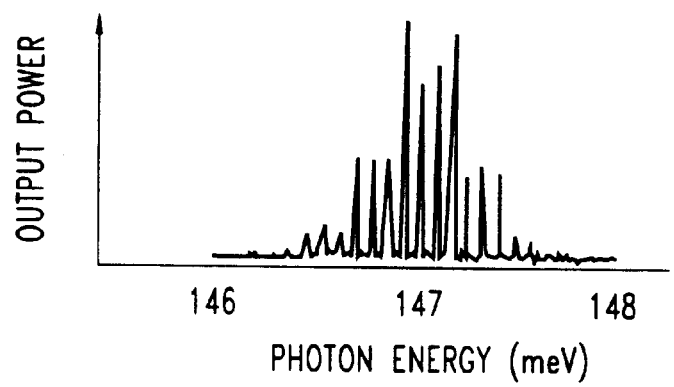
FIG. 5 shows a optical power spectrum of a QC laser of a type shown in FIG. 3 when the QC laser is pumped with a 2.5 amp current and operated at about 10° Kelvin (°K)

FIG. 5 shows the power spectrum of the exemplary embodiment of QC laser 50 of FIG. 3 when pumped with a current of about 2.5 amps at a temperature of about 10° K. The power spectrum has a center wavelength of about 8.4 nm, which corresponds to a minigap 42 of about 151 meV.

Figure 6:
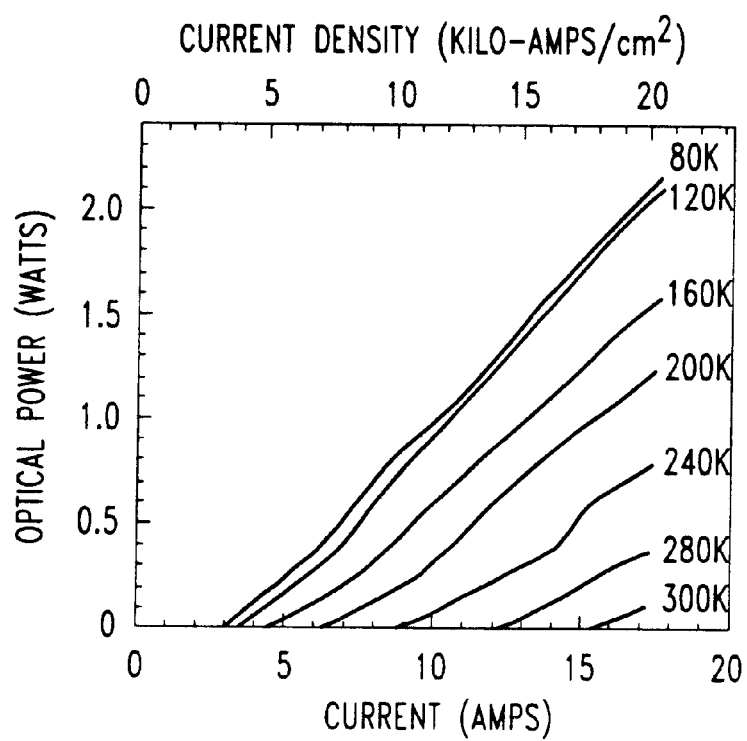
FIG. 6 shows optical power-current characteristics of the same QC laser for various operating temperatures.

FIG. 6 shows the optical power-current characteristics of the exemplary embodiment of QC laser 50 of FIG. 3 for operating temperatures in the range of about 80° K to about 300° K. At 80° K, the output optical power increases approximately linearly with temperature over a range of currents that is several times the size of the lasing threshold current. The exemplary embodiment of QC laser 50 has output optical powers of 1 watt (W) or more at temperatures below about 200° K, and an output optical power of at least 0.15 watts at temperatures below about 300° K. The output optical power does not saturate for pumping currents of at least 17 amps, i.e., current densities of at least 20 amps/$cm^2$. This performance results from satisfying the flat-miniband and miniband mismatch conditions over the range of above-threshold pumping currents.

Figure 7:
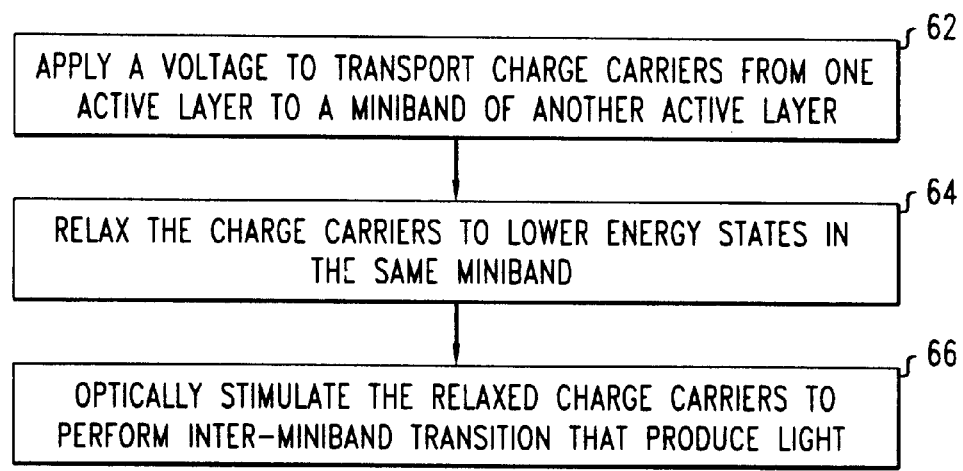
FIG. 7 is a flow chart for a process of operating the QC laser of FIG. 3.

FIG. 7 illustrates a process 60 for operating optical gain medium 30 of FIG. 2. The process 60 includes applying a pump voltage across the optical gain medium to cause transport minibands to transport charge carriers from a lower miniband 38 of one active layer 32 to a target upper miniband 36 of an adjacent active layer 32' (step 62). The applied pump voltage is larger than an onset voltage needed to stimulate optical emissions in the optical gain medium 30. The process 60 includes relaxing the transported charge carriers to lower energy states in the same target upper minibands 36 that received the transported charge carriers (step 64). The process 60 includes optically stimulating the relaxed charge carriers to perform inter-miniband transitions that produce light (step 66). The intra-miniband transitions are to lower minibands 38 in the same active layers 32' in which the charge carriers relaxed.

Figure 8:
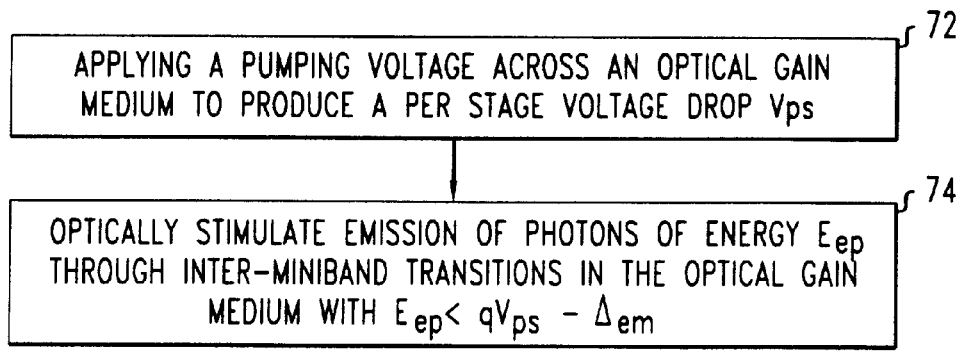
FIG. 8 is a flow chart for a process for operating a QC laser having the optical gain medium of FIG. 2.

FIG. 8 illustrates a process 70 for operating a QC laser having the optical gain medium 30 of FIG. 2, e.g., QC laser 50 of FIG. 3. The process 60 includes applying a pumping voltage, $V_p$, across the optical gain medium 30 to transport carriers of charge, q, from one active layer 32 to an adjacent active layer 32' (step 72). The applied pumping voltage, $V_p$, produces a per stage voltage drop, $V_{ps}$, that satisfies $qV_{ps} > \Delta_{lm} + E_{mg}$. The process 70 includes optically stimulating carriers in the active layer 32' to make inter-miniband transitions with emission of photons with an average energy, $E_{ep}$, that satisfies $E_{ep} < qV_{ps} - \Delta_{lm}$, i.e., $E_{ep} = E_{mg}$ (step 72). The intra-miniband transitions are to lower minibands 38 in the same active layer 32' to which the charge carriers were transported. Here, $qV_{ps} - \Delta_{lm} - E_{ep}$ is more than the line width, i.e., in energy units, for the light produced by stimulated emission in the gain medium 30. Preferably, $E_{ep}$ is smaller than $qV_{ps} - \Delta_{lm}$ by 3–5 or more times the average thermal energy of the carriers in the upper miniband 36 of the active layers 32'.

Other embodiments of the invention will be apparent to those of skill in the are in light of the specification, drawings, and claims of this application.

What we claim is:

1. An apparatus for a laser, comprising:
    an optical waveguide having an optical core layer and optical cladding layers on opposite sides of the optical core layer, the optical core layer comprising an optical gain medium having first and second active layers and an injector layer interposed between the first and second active layers, the active layers having upper minibands and lower minibands, the active and injector layers comprising semiconductor superlattice structures; and
    a Fabry-Perot cavity, the optical gain medium being located in the Fabry-Perot cavity; and
    wherein the injector layer has a miniband that transports charge carriers from the lower miniband of the first active layer to an excited state in the upper miniband of the second active layer in response to application of a voltage across the optical gain medium, a lower edge of the miniband of the injector layer having a higher energy than a lower edge of the upper miniband of the second active layer when the voltage is applied;
    wherein the apparatus is a quantum cascade laser and the mismatch between the lower edges of the miniband of the injector layer and the upper miniband of the second active layer in response to the applied voltage is larger than an energy associated with the line width of laser light from the quantum cascade laser.

2. The apparatus of claim 1, wherein the semiconductor superlattice structures include gallium and arsenic.

3. The apparatus of claim 1, wherein the upper miniband of the second active layer has a lower energy state to which charge carriers are able to relax from the excited state.

4. The apparatus of claim 1, wherein the mismatch between the lower edges when the voltage is applied is more than three times an average thermal energy of charge carriers in the upper miniband of the second active layer at about 300° K.

5. The apparatus of claim 1, wherein transitions of charge carriers between minibands of the same active layer produce photons during lasing.

6. The apparatus of claim 1, wherein the upper minibands have a width $\Delta_{um}$ that is at least three times the average thermal energy of charge carriers therein at 300° K.

7. A process for operating an optical gain medium having a sequence of alternating active layers with upper and lower minibands and injector layers with transport minibands, comprising:
    applying a voltage across the optical gain medium, the optical gain medium being located in an optical core layer of an optical waveguide, the optical waveguide comprising the optical core layer and optical cladding layers adjacent the optical core layer, the active and injector layers being semiconductor superlattice structures; and
    wherein the applying a voltage aligns lower edges of a portion of the transport minibands to have higher energies than lower edges of the upper minibands in adjacent receiving ones of the active layers, the applying causing charge carriers to be transported via the injector layers from the lower minibands of the active layers to the upper minibands of adjacent ones of the active layers; and
    wherein the transported charge carriers relax to lower energy states in the same upper minibands that received the transported carriers.

8. The process of claim 7, further comprising:
    causing a laser cavity to emit light by optically stimulating transitions of a portion of the relaxed charge carriers from the upper minibands to the lower minibands in the same active layers.

9. An apparatus, comprising:
    an optical waveguide comprising an optical core layer and optical cladding layers located adjacent opposite sides of the optical core layer, the core layer comprising an optical gain medium having a series of stages, each stage comprising an injector layer and an adjacent active layer, the injector and active layers being semiconductor superlattice structures, the active layers having upper and lower minibands that are separated by a miniband gap of energy $E_{mg}$, the lower minibands having a width $\Delta_{lm}$, each injector layer having a transport miniband; and
    electrical contacts being adjacent opposite sides of the optical gain medium; and
    wherein the stages are configured such that a selected current flow between the contacts produces a voltage $V_{ps}$ across each one of the stages and a flat-band condition for each one of the stages between the transport miniband and the lower miniband therein; and
    wherein $E_{mg}$ is smaller than $qV_{ps} - \Delta_{lm}$, q being a charge of charge carriers in the minibands.

10. The apparatus of claim 9, wherein the apparatus is a quantum cascade laser and $E_{mg}$ is the energy of photons produced by the laser during lasing.

11. The apparatus of claim 10, wherein $E_{mg}$ is smaller than $qV_{ps} - \Delta_{lm}$ by at least three times an energy associated with the line width of laser light produced by the quantum cascade laser.

12. The apparatus of claim 10, wherein $E_{mg}$ is smaller than $qV_{ps} - \Delta_{lm}$ by at least three times an average thermal energy of charge carriers in the upper minibands at about 300° K.

13. A process for operating a quantum cascade laser having an optical gain medium, the optical gain medium comprising a sequence of active layers, the active layers having upper and lower minibands, comprising:

applying a pumping voltage across the optical gain medium to transport carriers of charge q between adjacent pairs of the active layers, the applying a pumping voltage producing a voltage drop $V_{ps}$ between the adjacent pairs of the active layers, each adjacent pair of the active layers being connected by an associated injector layer having a transport miniband, the active and injector layers being semiconductor superlattice structures, the gain medium being located in an optical core layer of an optical waveguide, the waveguide comprising the optical core layer and optical cladding layers adjacent the optical core layer and being located in a Fabry-Perot cavity;

optically stimulating the carriers to emit photons by making transitions between the upper and lower minibands of the active layers, the upper and lower minibands of the active layers being separated by a minigap with energy $E_{mg}$, the lower minibands having a width $\Delta_{lm}$; and wherein the energy $E_{mg}$ satisfies $E_{mg} < qV_{ps}\Delta_{lm}$; and wherein the applying produces a flat-band condition for the transport minibands and associated source ones of the lower minibands.

14. The process of claim 13, wherein $E_{mg}$ is smaller than $qV_{ps} - \Delta_{lm}$ by at least three times an average thermal energy of charge carriers in the upper minibands at about 300° K.

15. The process of claim 13, wherein $qV_{ps} - \Delta_{lm} - E_{mg}$ is equal to or greater than three times an energy associated with the line width of the laser.

\* \* \* \* \*

UNITED STATES PATENT AND TRADEMARK OFFICE
CERTIFICATE OF CORRECTION

PATENT NO. : 6,690,699 B2  
DATED : February 10, 2004  
INVENTOR(S) : Federico Capasso et al.

It is certified that error appears in the above-identified patent and that said Letters Patent is hereby corrected as shown below:

<u>Title page,</u>
Item [73], Assignee, insert -- Lucent Technologies Inc., Murray Hill, N.J. --

Signed and Sealed this

Twenty-eighth Day of September, 2004

JON W. DUDAS
*Director of the United States Patent and Trademark Office*